United States Patent

Tanitsu

[11] Patent Number: 6,081,320
[45] Date of Patent: Jun. 27, 2000

[54] ILLUMINATION APPARATUS AND EXPOSURE APPARATUS

[75] Inventor: Osamu Tanitsu, Funabashi, Japan

[73] Assignee: Nikon Corporation, Tokyo, Japan

[21] Appl. No.: 08/974,832

[22] Filed: Nov. 20, 1997

[30] Foreign Application Priority Data

Nov. 22, 1996 [JP] Japan ..................................... 8-327585

[51] Int. Cl.⁷ ........................... G03B 27/72; G03B 27/42; G03B 27/54
[52] U.S. Cl. ............................ 355/71; 355/53.22; 355/67
[58] Field of Search ................................ 355/71, 67, 53; 250/201.5; 353/31

[56] References Cited

U.S. PATENT DOCUMENTS

| | | | |
|---|---|---|---|
| 4,856,904 | 8/1989 | Akagawa | 356/400 |
| 5,534,970 | 7/1996 | Nakashima et al. | 355/53 |
| 5,673,102 | 9/1997 | Suzuki et al. | 355/53 |
| 5,731,577 | 3/1998 | Tanitsu | 250/201.5 |

FOREIGN PATENT DOCUMENTS 8-293461  11/1996  Japan .

*Primary Examiner*—Safet Metjahic
*Assistant Examiner*—Peter B. Kim
*Attorney, Agent, or Firm*—Morgan, Lewis & Bockius LLP

[57] ABSTRACT

An illumination apparatus in which angles and positional deviations of a laser beam on an illuminated surface can be detected by one detecting system with high accuracy. The illumination apparatus includes a light dividing unit (such as a beamsplitter) that is located between a laser source and the illuminated surface and that splits off a portion of the laser beam, a detecting unit that detects positional deviations and angular deviations of the laser beam relative to a reference axis based on the split off portion of the laser beam, and a light controlling unit, such as a shutting member with a pinhole. The light controlling unit is positioned on the optical path between the laser source and the illuminated surface when an angle of the laser beam are detected relative to the reference axis. The shutting member is removed from the optical path when positional deviations of the laser beam are detected relative to the reference axis.

38 Claims, 4 Drawing Sheets

ILLUMINATION APPARATUS AND EXPOSURE APPARATUS

This application claims the benefit of Japanese Patent Application No. 08-327585, filed Nov. 22, 1996, which is hereby incorporated by reference.

BACKGROUND OF THE INVENTION

1. Field of the Invention

The present invention relates to an illumination apparatus and an exposure apparatus used in semiconductor manufacturing, and, more particularly, to compensation of angular and positional deviations of a laser beam in the exposure apparatus having an excimer laser source.

2. Discussion of the Related Art

In an illumination apparatus according to the specification and drawings of Japanese Patent Utility Model H7-120862 (filed Apr. 21, 1995), a first four-point-probe four-directional sensor detects angular deviation of a laser beam relative to a design optical axis, and a second four-point-probe sensor detects positional deviations of the laser beam relative to the design optical axis. The measurement performed by such a four-point-probe sensor generally is inaccurate. In this example of conventional technology, errors in measurement often occur when an intensity distribution of the laser beam varies. Additionally, the first detecting system for angular deviation of the laser beam and the second detecting system for positional deviation of the laser beam must be independently located and the overall size of the apparatus tends to be large.

SUMMARY OF THE INVENTION

Accordingly, the present invention is directed to an illumination apparatus and exposure apparatus that substantially obviates one or more of the problems due to the limitations and disadvantages of the related art.

One object of the present invention is to provide an illumination and exposure apparatus that detects angles and positional deviations of laser beam on an illuminated surface with a simple detecting system and resulting in high accuracy.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages, and in accordance with the purpose of the present invention, as embodied and broadly described, in a first aspect of the present invention there is provided an illumination apparatus including a laser source emitting a laser beam towards an illuminated surface along a reference axis, a beamsplitter located between the laser source and the illuminated surface and splitting off a portion of the laser beam, a detector detecting the portion of the laser beam on a detector surface optically conjugate with the illuminated surface, an angle adjusting unit for aligning the laser beam along the reference axis, a parallel moving unit for compensating for positional deviations of the laser beam, a movable shutting member located between the laser source and the illuminated surface, and a controller controlling the parallel moving unit and the angle adjusting unit in response to output signals from the detector.

In a second aspect of the present invention there is provided an exposure apparatus for semiconductor device manufacturing including a laser source emitting a laser beam along a reference axis towards an illuminated surface, an angular deviation adjuster in a path of the laser beam, a positional deviation adjuster in the path of the laser beam, a beamsplitter splitting off a portion of the laser beam towards a detector having a surface conjugate with the illuminated surface, and a controller controlling the angular deviation adjuster and the positional deviation adjuster in response to output signals from the detector.

In a third aspect of the present invention there is provided a method of controlling a position and direction of a laser beam in an illumination apparatus having a laser source emitting a laser beam towards an illuminated surface along a reference axis, a beamsplitter located between the laser source and the illuminated surface and splitting off a portion of the laser beam, a detector detecting the portion of the laser beam on a detector surface optically conjugate with the illuminated surface, an angle adjusting unit for aligning the laser beam along the reference axis, a parallel moving unit for compensating for positional deviations of the laser beam, a movable shutting member located between the laser source and the illuminated surface, and a controller controlling the parallel moving unit and the angle adjusting unit in response to output signals from the detector, the method comprising the steps of positioning the movable shutting member in an optical path, detecting the position and the direction of the laser beam using the detector, adjusting the direction of the laser beam using the angle adjusting unit, removing the movable shutting member from the optical path and detecting the position of the laser beam using the detector; and adjusting the position of the laser beam using the parallel moving unit.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

The present invention provides an exposure apparatus including the illumination apparatus, as well as an illumination optical system that illuminates a mask using laser light emitted from an excimer laser in order to expose a mask pattern on a mask onto a photosensitive substrate. The illumination optical system includes an optical integrator splitting a single laser beam into a plurality of beams by receiving light emitted from the illuminated surface of the illumination apparatus. A condenser optical system superposingly illuminates the mask by condensing the light from each of a plurality of light beams.

The present invention also provides a production method for semiconductor devices including an exposure process wherein the mask pattern is exposed onto a photosensitive substrate by the exposure apparatus of the present invention. It is preferable that this method include an adjustment process to adjust the positions of the laser beam from the illumination optical system prior to the exposure process. The adjustment process includes a first detection process which positions the light controlling unit (such as a shutting member) in an optical path and detects a position of the laser beam that reaches the detector surface via the light controlling unit, a first compensation process that compensates angles of the laser beam incident on the optical integrator via the angle adjusting unit based on information detected during the first detection process, a second detection process that removes the light controlling unit from the optical path and detects positions of laser beam which reaches the given surface using the detecting unit, and a second compensation process that compensates for positional deviations of the laser beam incident on the optical integrator via a parallel moving unit (a deviation compensating unit) based on information detected during the second detection process.

Figure 2:
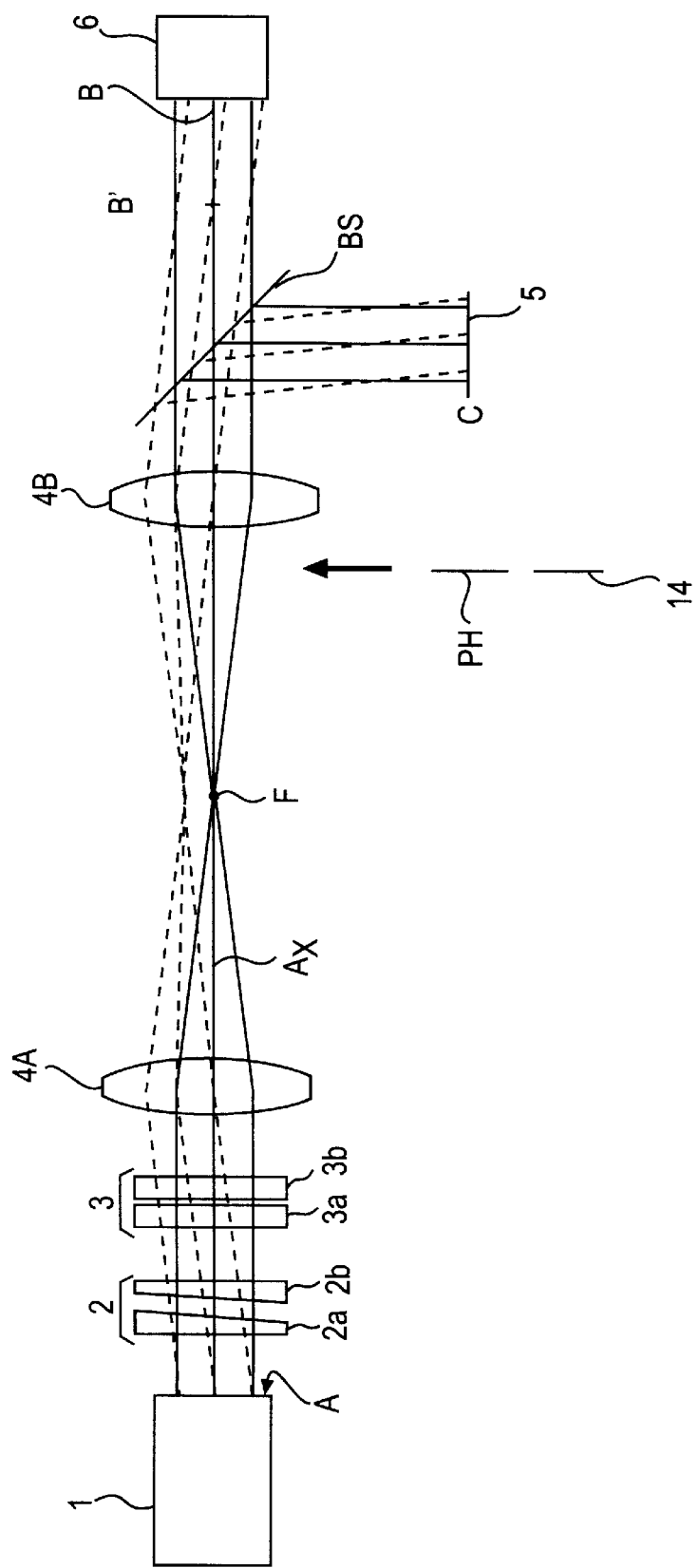
FIG. 2 shows a basic structure of the illumination apparatus of the present invention.

FIG. 2 shows a structure of the illumination apparatus of the present invention. Parallel light beams (indicated by solid lines in FIG. 2) are emitted from a laser source 1. The laser beam is emitted along the optical axis Ax, which is a reference axis, and enters a collimating lens (a first collecting lens) 4A via a pair of prisms 2 and a pair of parallel planar plates 3. The pair of prisms 2 form an angle adjusting unit to adjust an angle of the light beam relative to the optical axis Ax. The pair of parallel planar plates 3 also form a parallel moving unit (a deviation compensating unit) for moving the laser beam relative to the optical axis Ax. Detailed structure and functions of the pair of prisms 2 and the pair of parallel planar plates 3 will be discussed below.

The laser beam converging at a point F on the optical axis Ax via the collimating lens 4A becomes parallel again after passing through a collimating lens (a second collecting lens) 4B, and then enters a beamsplitter BS. The laser beam then enters an optical integrator such as a fly eye lens 6. Here, an exiting plane A of laser source 1 and an entering plane B of the fly eye lens 6 are optically conjugate to each other (that is, optically equivalent) due to the collimating lenses 4A and 4B.

Here, the entering plane B of the fly eye lens 6 is an illuminated surface of the illumination apparatus of the present invention. On the other hand, a position of the laser beam reflected by the beamsplitter BS enters a CCD 5 (charge coupled device), for example, which is preferably structured to be two-dimensional. An image surface of the CCD 5 is located at a position C, which is conjugate with the entering plane B of the fly eye lens 6.

In an actual structure, plane B', which differs from the structurally conjugate or entering plane B, becomes conjugate with the exiting plane A of laser source 1 due to aberrations, manufacturing errors and structural errors with respect to the collimating lens 4A and the collimating lens 4B. As a result, when the laser source 1 is slanted relative to the optical axis Ax, parallel beams (indicated by dotted lines in FIG. 2) emitted from laser source 1 relative to the optical axis Ax do not deviate in position on actual conjugate plane B'. Nonetheless, the laser beam deviates in position on the entering plane of the fly eye lens 6 and the image surface of the CCD 5, which are structurally conjugate planes.

A shutting member 14 having a pin hole PH is positioned in the optical path at a position between the laser source 1 and the CCD 5. Here, the shutting member is inserted in or removed from the optical path by an exchanging device 20 (a driving unit) controlled by the controller 13. The shutting member 14 is sufficiently distant from the laser source 1, the CCD 5 and the converging point F.

FIGS. 3(a)–3(f) show a process of detection of angular and positional deviations of laser beam and their compensations in the apparatus of the present invention. In FIGS. 3(a)–3(f), only the collimating lenses 4A, 4B such as a relay optical system, the shutting member 14 and the CCD 5 of FIG. 2 are shown.

Figure 3A:
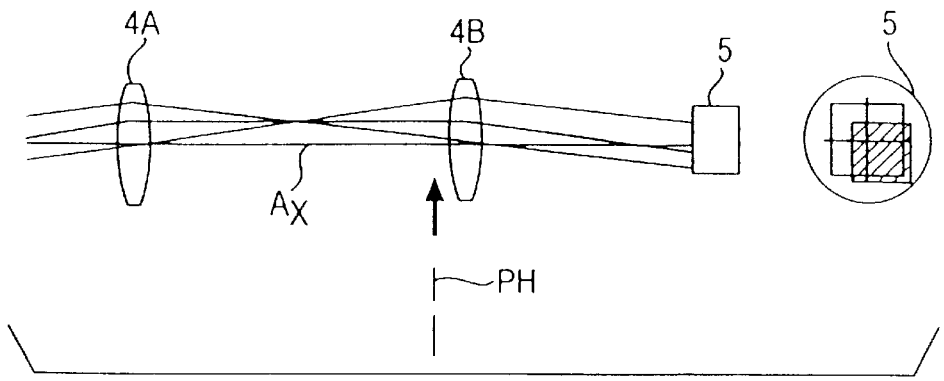
FIGS. 3(a) to 3(f) illustrate a process of detection of angular and positional deviations of laser beam and their compensations in the illumination apparatus of the present invention.
Figure 3B:
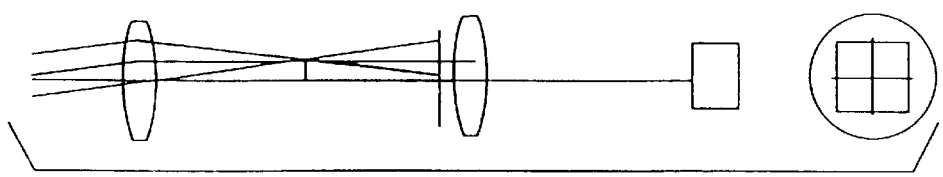

First, as shown in FIG. 3(a), the center position of a rectangular-shaped laser beam (indicated by meshing in FIG. 3a) that reaches the image surface of the CCD 5 deviates from the optical axis Ax prior to detection and compensation. Next, as shown in FIG. 3(b), the shutting member 14 is inserted in the optical axis Ax, so that only the center position of a pin-spot laser beam reaches the image surface of the CCD 5 through the pin hole PH is detected.

Figure 3C:
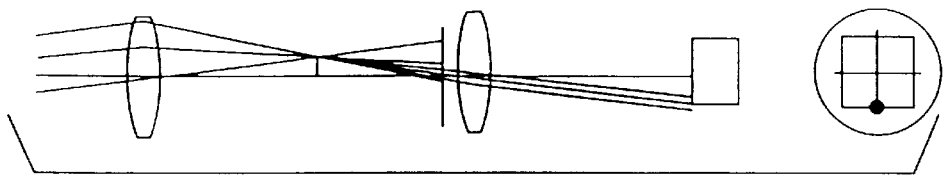

If the angle of the laser beam emitted from the laser source 1 relative to the optical axis Ax becomes too large, the laser beam does not pass through the pin hole PH. Consequently, the pin-spot laser beam may not reach the image surface of the CCD 5. In this case, as shown in FIG. 3(c), the center position of the pin-spot laser beam that reaches the image surface of the CCD 5 can be detected by moving the laser beam emitted from laser source 1 relative to the optical axis Ax by moving the pair of parallel planar plates 3, so that the laser beam enters the pin hole PH.

The detected center position of the pin-spot laser beam deviates from the optical axis Ax. Then, the amount of deviation between the center position of the pin-spot laser beam and the optical axis Ax corresponds to the angle of the laser beam reaching the image surface of the CCD 5 relative to the optical axis Ax.

Figure 3D:
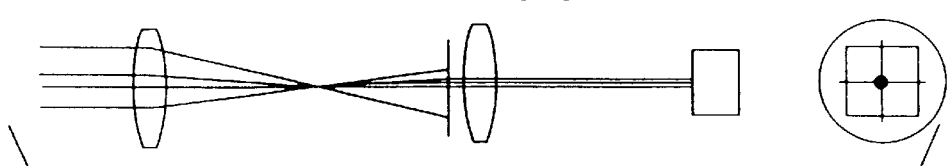

Therefore, as shown in FIG. 3(d), the angle of the laser beam that reaches the image surface of the CCD 5 relative to the optical axis Ax, and thus the angle of laser beam that reaches the entering plane of the fly eye lens 6 (the illuminated surface) relative to the optical axis Ax, can be compensated for by adjusting the angle of laser beam relative to the optical axis Ax by using the pair of prisms 2, so that the center position of the pin-spot laser beam that reaches the image surface of the CCD 5 superposes onto the optical axis Ax.

Figure 3E:
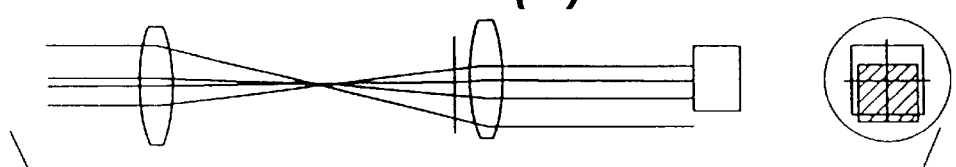
Figure 3F:
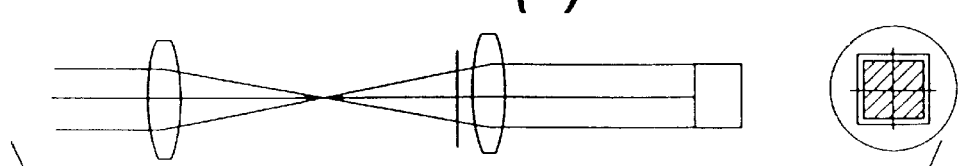
Figure 4:
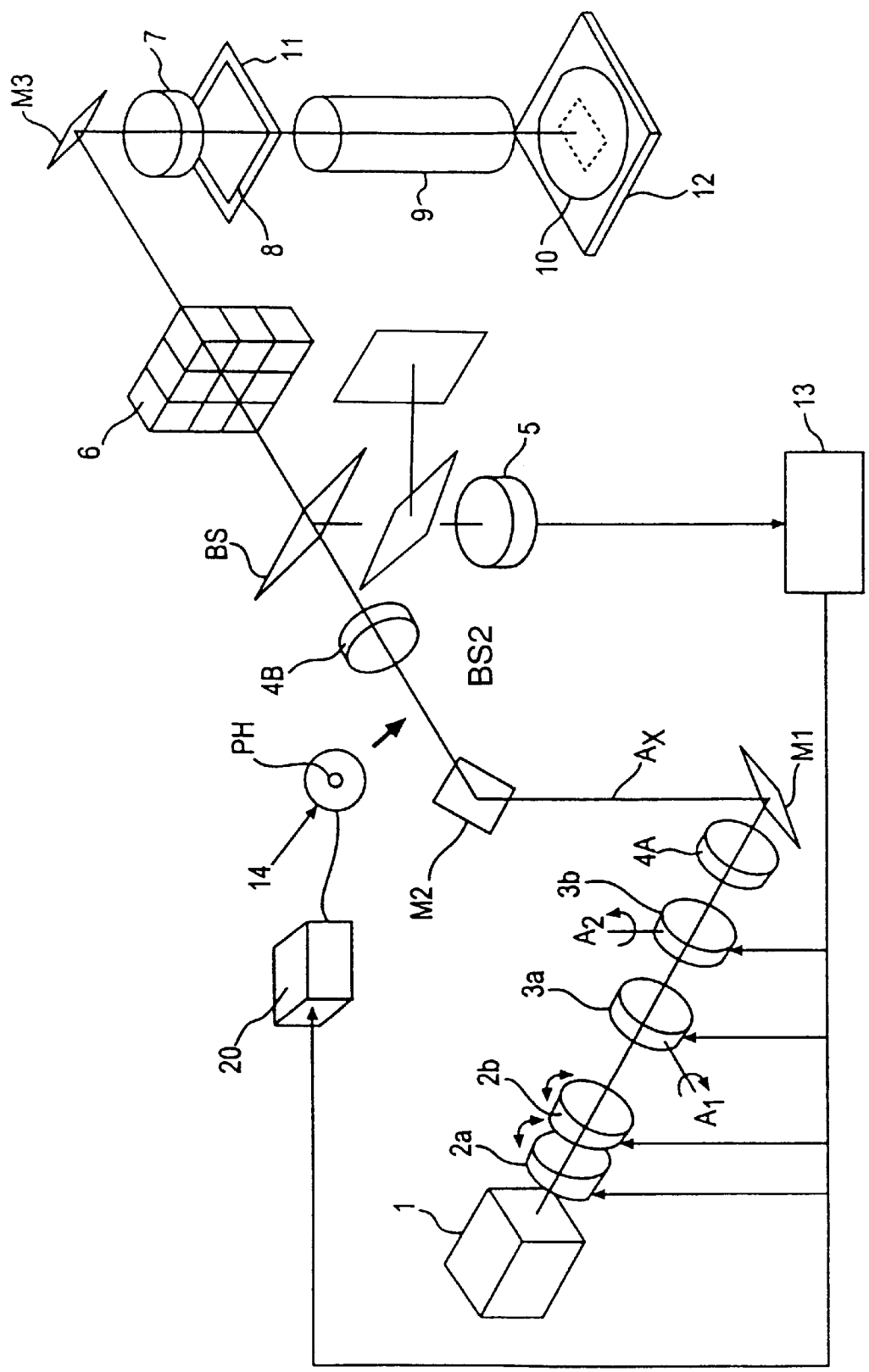
FIG. 4 illustrates another embodiment of the present invention.

Thereafter, as shown in FIG. 3(e), when the pin hole PH is removed from the optical path, the center position of the rectangular-shaped laser beam (indicated by meshing in FIGS. 3(a)–3(f)) that reaches the image surface of the CCD 5 deviates from the optical axis Ax. In this case, the deviation between the center position of the rectangular-shaped laser beam and the optical axis Ax corresponds to the positional deviation of the laser beam relative to the optical axis of the laser beam that reaches the image surface of the CCD 5. Thus, as shown in FIG. 3(f), the positional deviation of the laser beam that reaches the image surface of the CCD 5 relative to the optical axis Ax and the positional deviation of the laser beam that reaches the entering plane of the fly eye lens 6 (the illuminated surface) relative to the optical axis Ax, can be compensated for by vertically moving the laser beam parallel (transverse) to the optical axis by using the pair of parallel planar plates 3, so that the center position of the rectangular-shaped laser beam that reaches the image surface of the CCD 5 superposes onto the optical axis Ax.

It is possible that the laser beam might slant slightly relative to the optical axis Ax when the laser beam is moved vertically relative to the optical axis Ax (parallel or transverse to the optical axis Ax) by using the pair parallel planar plates 3, so that the center position of the rectangular-shaped laser beam may superpose onto the optical axis Ax. Therefore, the angular and positional deviations of the laser beam can be compensated for with high accuracy by repeating the process shown in FIGS. 3(c) through 3(f), as necessary.

In the illumination apparatus of the present invention described above, both the angular and positional deviations of the laser beam on the illuminated surface can be detected by a single detecting system with high accuracy through the use of a high accuracy sensor such as a CCD. Accordingly, the detected angular and positional deviations can be compensated for with high accuracy without increasing the size of the apparatus.

In addition, stable exposure can be provided by using the illumination apparatus of the present invention in an exposure apparatus that transfers patterns of a mask onto a photosensitive substrate, so that the mask and the substrate can be constantly and sufficiently illuminated.

A working example will be described with reference to the attached drawings.

Figure 1:
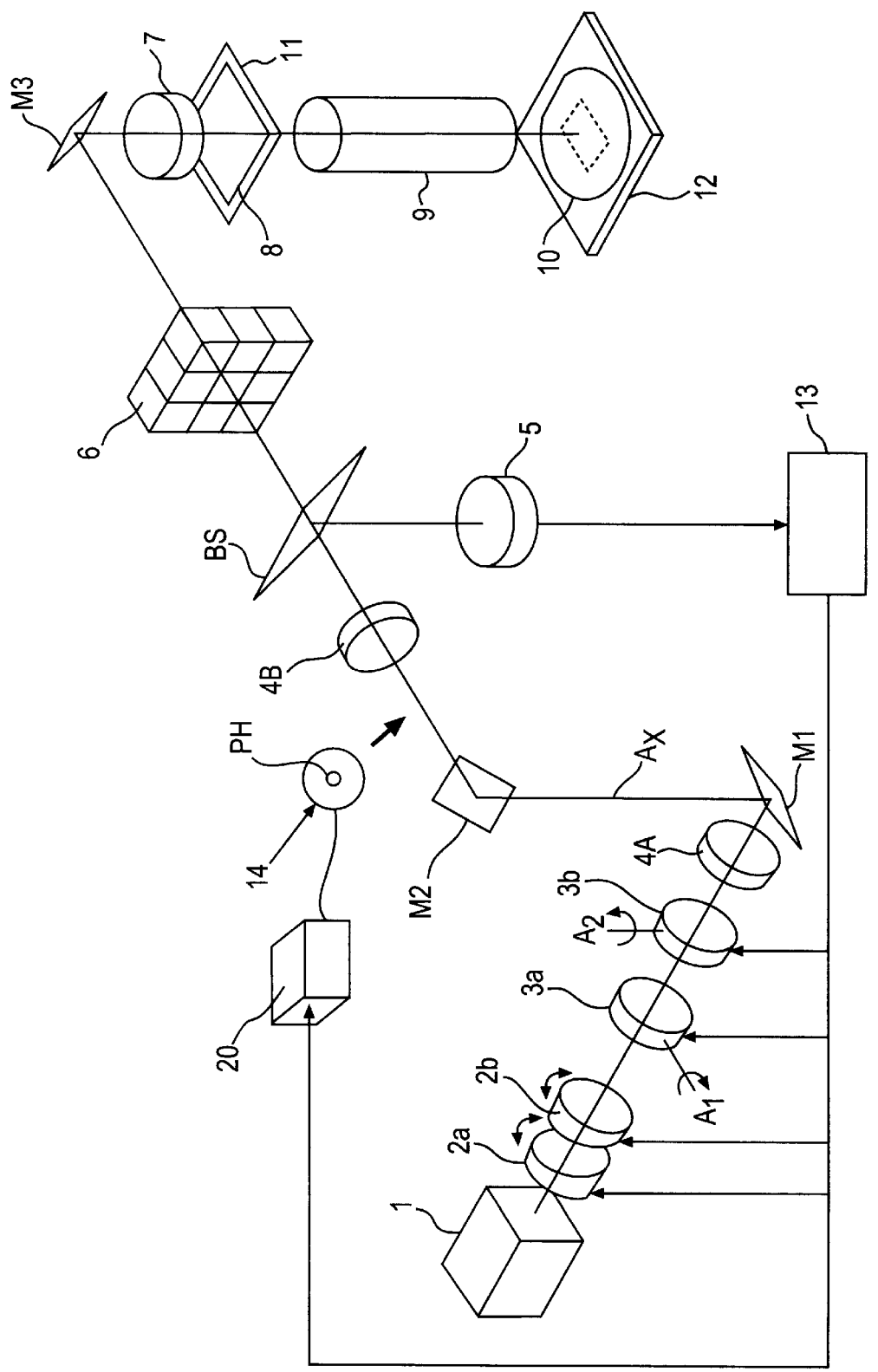
FIG. 1 is a schematic structure of an illumination and exposure apparatus of the present invention.

FIG. 1 shows a schematic of a structure of an exposure apparatus including the illumination apparatus of the present invention.

The exposure apparatus of FIG. 1 includes an excimer laser 1 that emits, for example, laser light at 248 nm or 193 nm. A rectangular-shaped parallel light beam supplied by the excimer laser 1 enters an angle adjusting unit formed by the pair of deflection angle prisms 2, including prisms 2a and 2b. Apex angles of the deflection angle prisms 2a and 2b are equal, and a surface of the deflection angle prism 2a on the entry side and a surface of the deflection angle prism 2b on the exit side are both perpendicular to the optical axis Ax. The deflection angle prisms 2a and 2b are also individually rotatable around the optical axis Ax. Accordingly, the entering laser beam can be slanted by a desired angle relative to the optical axis Ax by individually rotating the prisms 2a and 2b around the optical axis Ax in order to realign the laser beam along the optical axis Ax.

The parallel laser beam which has passed the pair of deflection angle prisms 2a and 2b enters the parallel moving unit (the deviation compensating unit) including the pair of parallel planar plates 3a and 3b. The pair of parallel planar plates 3a and 3b are individually rotatable around two axes A1 and A2 that cross each other perpendicularly in a plane perpendicular to the reference axis (or the optical axis Ax). Accordingly, the entering parallel light beam can be moved parallel (tranverse) to the optical axis Ax by a desired distance in a plane perpendicular to the optical axis Ax by rotating the parallel planar plates 3a and 3b around the axes A1 and A2.

The laser beam that has passed the parallel planar plates 3a and 3b is converged between reflective mirrors M1 and M2 by the first collimating lens 4A (the first collecting lens) and then enters the second collimating lens 4B (the second collecting lens) The laser beam becomes parallel again after the laser beam passing through the second collimating lens 4B, and then enters beamsplitter BS.

After passing the beamsplitter BS, the laser beam enters an optical integrator, such as the fly eye lens 6. The laser exiting plane of the excimer laser 1 and the entering plane of the fly eye lens 6 as an illuminated surface of an illumination apparatus of the present invention are optically conjugate with each other through a system of the collimating lenses 4A, 4B (the relay optical system).

The laser beam that has entered the fly eye lens 6 is two-dimensionally divided by a plurality of lens elements that form the fly eye lens 6, and then form a plurality of images at the back focal point of the fly eye lens 6. The laser beams from the plurality of images are reflected by a reflective mirror M3, and enter a third collimating lens 7 (a condenser optical system).

After being converged by the third collimating lens 7, the laser beam superposingly illuminates a mask 8 on which a pattern is formed. The laser beam that has passed the mask 8 forms the pattern image of the mask 8 after passing through a projection optical system 9 and irradiating a wafer 10, which would normally be coated with a photosensitive coating. The pattern image of mask 8 is projected onto the photosensitive substrate such as the wafer 10 by the projection optical system. Here, the mask 8 is mounted on a mask stage 11 perpendicularly to the optical axis Ax. On the other hand, the wafer 10 is mounted on a wafer stage 12 that is two-dimensionally movable in a plane perpendicular to the optical axis Ax.

Accordingly the pattern image of the mask 8 can be repeatedly transferred to each section of the wafer 10 by moving the wafer stage 12, and thus the wafer 10, relative to the projection optical system 9. Here, the entering plane of the fly eye lens 6 is optically conjugate with the mask 8 (or the wafer 10).

On the other hand, the laser beam reflected by the beamsplitter BS enters the two-dimensional CCD 5. The image surface of the CCD 5 is optically conjugate with the entering plane of the fly eye lens 6. In other words, the image surface of the CCD 5 is optically conjugate with the mask 8 (or the wafer 10). Output signals from the CCD 5 are outputted to a controller 13. The controller 13 separately drives the pair of prisms 2a and 2b and the pair of parallel planar plates 3a and 3b in response to the output signals from the CCD 5. Also, the controller 13 drives the shutting member 14, which is inserted in or removed from the optical path between the reflective mirror M2 and the beamsplitter BS, by using the exchanging device 20 (the driving unit).

The following describes a detecting process and a compensation process for angular and positional deviations of the laser beam in the exposure apparatus described above.

First, prior to the detecting and compensation process for the angular and positional deviations of the laser beam on the image surface of the CCD 5, a calibration for a correlation between the amount by which the pair of deflection angle prisms 2a and 2b are driven, and the amount by which the pin-spot laser beam is moved on the image surface of the CCD 5, needs to be performed. A calibration for a correlation between the amount by which the pair of parallel planar plates 3a and 3b are driven, and the amount by which the rectangular-shaped laser beam is moved on the image surface of the CCD 5, needs to be performed as well.

Next, the controller 13 inserts the shutting member 14 with the pin hole PH on the optical axis Ax by using the exchanging device 20 and detects the amount by which the center position of the pin-spot laser beam reaching the image surface of the CCD 5 deviates from the optical axis Ax, based on photoelectric signals from each pixel of the CCD 5. If the pin-spot laser beam cannot be detected on the image surface of the CCD 5, the laser beam is moved by using the pair of parallel planar plates 3 parallel (tranverse) to the optical axis Ax until the pin-spot laser beam can be detected on the image surface of the CCD 5. Then, the controller drives the pair of deflection angle prisms 2a and 2b so that the center position of the pin-spot laser beam may superpose the optical axis Ax, based on a detected deviation and the results of the calibrations. As a result, the angle of the laser beam on the image surface of the CCD 5, and the angle of the laser beam on the entering plane of the fly eye lens 6 can be compensated.

Thereafter, the controller 13 removes the shutting member 14 from the optical path and detects the amount by which the center position of the rectangular-shaped laser beam reaching the image surface of the CCD 5 deviates from the optical axis Ax, based on photoelectric signals from each pixel of the CCD 5. Then, the controller 13 drives the pair of parallel planar plates 3a and 3b so that the center portion of the rectangular-shaped laser beam may superpose the optical axis Ax, based on the detected deviation and the results of the calibration. As a result, the positional deviations of the laser beam on the image surface of the CCD 5, and the positional deviations of the laser beam on the entering plane of the fly eye lens 6 can be compensated for.

As described previously, the accuracy in compensation can be improved by repositioning the shutting member 14 on the optical axis Ax to repeat the process of compensating for the angular deviation of the laser beam and by removing the shutting member 14 from the optical axis Ax to repeat the process of compensating for the positional deviations of the laser beam.

In this example of using the CCD 5 with high measurement accuracy, both the angular deviation and the positional deviation of the laser beam on the illuminated surface can be detected by one detecting system with a high degree of accuracy. Therefore, the detected angular and positional deviations can be compensated for with high accuracy and without enlarging the apparatus. Also, the mask 8 and the wafer 10 can always be illuminated with an appropriate and stable exposure.

After the exposure process a (photolithographic process) using the exposure apparatus of the present invention, the wafer 10 goes through a developing process, an etching process to remove the undeveloped resist, and a resist removing process to remove any remaining resist after the etching process. When these processes are finished, a wafer process is completed.

Thus, a semiconductor device such as an LSI circuit can be produced as a final product in a full assembly process, after a dicing process to produce chips by cutting wafers according to photo-printed circuits, a bonding process to bond wires to each chip, and a packaging process to package each chip. This working example shows a process of semiconductor device production by a photolithographic process using the exposure apparatus of the present invention. However, the photolithographic process using the exposure apparatus of the present invention can be adapted to production of other semiconductor devices, such as liquid crystal display devices, thin-layer magnetic heads and image pick-up devices (such as CCD's).

An alternative form of the preferred embodiment of the present invention has another beamsplitter BS2 located in the optical path between the CCD 5 and the beamsplitter BS in order to direct laser beam reflected by beamsplitter BS2 to an observation system. In this observation system, a transparent plate with indication marks, such as a glass plate, is arranged conjugate with the entering plane of the fly eye lens 6. Indication marks of the transparent plate corresponding to the optical axis Ax are formed by, for example, a ruling formed using chromium deposition. A fluorescent glass plate is located between the transparent plate and the beamsplitter BS2, and converts ultraviolet light into visible light. The fluorescent glass plate emits blue-green visible light corresponding to incoming laser light such as the excimer laser light. However, if the laser beam is in a visible part of the spectrum, the fluorescent glass plate is not necessary.

This alternative form of the preferred embodiment allows to quickly confirm the angular and the positional deviations of the laser beam by checking with a human eye the position of the laser beam reaching the glass plate by using the observation system, so that compensation can be automatically performed by activating the controller 13.

Also, other modifications, where, instead of the CCD 5, the above-mentioned the transparent plate is used, are possible. In this case, the angular and positional deviations of the laser beam are detected by the human eye using the observation system having the transparent plate and the fluorescent glass plate, and compensation is performed either using the controller 13 or manually.

In the above embodiment the deflection angle prisms 2a and 2b form an angle adjusting unit. It is also possible, to form the angle adjusting unit using one reflective mirror that is rotatable separately around two axes perpendicular to each other.

Also, in the above embodiment the parallel planar plates 3a and 3b form a parallel moving unit. It is also possible to form the parallel moving unit using one parallel planar plate which is rotatable separately around two axes perpendicular to each other.

Furthermore, although in the above embodiment an excimer laser is used, other light sources can be used instead of the excimer laser.

Additionally, in the above embodiment, both the angle adjusting unit and the parallel moving unit are located in the optical path between the laser source 1 and the first collimating lens 4A. In general, it is preferable to locate the angle adjusting unit and parallel moving unit in the optical path between laser source 1 and the beamsplitter BS in order to minimize the size of the apparatus and perform adjustments with high accuracy. However, a first angle adjusting unit and a first parallel moving unit can be located in the optical path between the beamsplitter BS and the CCD 5. Further, a second angle adjusting unit and a second parallel moving unit can be located in the optical path between beamsplitter BS and the fly eye lens 6. In this case, it is desirable that first and second angle adjusting units collaboratively adjust the direction of the laser beam, and that the first and second parallel moving units collaboratively adjust the positional deviations of the laser beam.

In the illumination apparatus of the present invention, an application of a sensor with a high measurement accuracy, such as a CCD, allows to detect both the angular and the positional deviations of the laser beam on the illuminated surface using only one detecting system with high accuracy. Therefore, the detected angular and positional deviations can be compensated for with high accuracy without enlarging the apparatus.

Consequently, the mask 8 and the wafer 10 can always be illuminated with a stable exposure by using the illumination apparatus of the present invention in an exposure apparatus.

Also, high-quality semiconductor devices can be produced by means of the exposure apparatus of the present invention.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. An illumination apparatus comprising:
   a light source emitting a light beam towards an illuminated surface along a reference axis;
   a beamsplitter located between the light source and the illuminated surface and drawing a portion of the laser beam;
   a detecting unit detecting the portion of the light beam on a predetermined surface optically conjugate with the illuminated surface;
   an angle adjusting unit for aligning the light beam along the reference axis;
   a parallel moving unit for compensating for positional deviations of the light beam; and
   a light shutting unit having a predetermined aperture;
   wherein the light shutting unit is located in an optical path between the light source and the predetermined surface while the angle adjusting unit aligns the light beam along the reference axis, and wherein the light shutting unit is located out of the optical path between the light source and the predetermined surface while the parallel moving unit compensates for positional deviation of the light beam.

2. The illumination apparatus according to claim 1, wherein the angle adjusting unit comprises a pair of refracting dispersing prisms having substantially identical apex angles and wherein each of the pair of refracting dispersing prisms is individually rotatable around the reference axis.

3. The illumination apparatus according to claim 1, wherein the parallel moving unit comprises a first planar plate rotatable around a first axis perpendicular to the reference axis, and a second planar plate rotatable around a second axis perpendicular to the reference axis and perpendicular to the first axis.

4. The illumination apparatus according to claim 1, further comprising a controller controlling the angle adjusting unit and the parallel moving unit:
   wherein the detecting unit comprises a two-dimensional charge coupled device disposed at the predetermined surface and supplying a detecting signal to the controller.

5. The illumination apparatus according to claim 1, wherein a transparent plate having an indication mark is located between the beamsplitter and the detecting unit and is optically conjugate with the illuminated surface.

6. The illumination apparatus according to claim 1, further comprising a collecting system disposed between the light source and the beamsplitter;
   wherein the collecting system comprises a first collecting system for collecting the light beam from the light source and a second collecting system for collecting the light beam from first collecting system and directing the light beam from the first collecting system to the illuminated surface;
   wherein the light source comprises an excimer laser;
   wherein the predetermined surface is disposed at an optically conjugate position with the illuminated surface;
   wherein the reference axis is an optical axis of the first collecting system and the second collecting system; and
   wherein the angle adjusting unit and the parallel moving unit are located in an optical path between the light source and the beamsplitter.

7. The illumination apparatus according to claim 1, wherein a transparent plate having an indication mark is positioned optically conjugate with the illuminated surface between the detecting unit and the beamsplitter; and
   a frequency converter for converting the beam to a visible spectrum light beam is located in an optical path between the transparent plate and the beamsplitter.

8. An exposure apparatus comprising:
   a light source optical system for supplying a light beam; and
   an illumination optical system for directing the light beam from the light source optical system to a mask formed with a predetermined pattern so as to expose the predetermined pattern upon a photosensitive substrate;
   wherein the illumination optical system comprises:
      an optical integrator for forming a plurality of beams based on the light beam from the light source; and
      a condenser optical system for condensing the plurality of beams and directing the plurality of beams to the mask;
   wherein the light source optical system comprises:
      a light source for emitting the light beam;
      a beamsplitter located between the light source and the illumination optical system;
      a detecting unit for detecting a portion of the light beam on a surface that is optically conjugate with the mask;
      an angle adjusting unit for adjusting an angle of the light beam with respect to an optical axis of the light source optical system;
      a deviation compensating unit that compensates for positional deviation of the light beam with respect to the optical axis of the light source optical system; and
      a light shutting unit having a predetermined aperture;
      wherein the light shutting unit is located in an optical path between the light source and the illumination optical system while the angle adjusting unit adjusts the angle of the light beam with respect to the optical axis of the light source optical system, and wherein the light shutting unit is located out of the optical path between the light source and the illumination optical system while the deviation compensating unit compensates for positional deviation of the light beam with respect to the optical axis of the light source optical system.

9. An exposure apparatus according to claim 8, wherein the optical integrator is positioned having an entering plane nearly optically conjugate with the mask.

10. The illumination apparatus of claim 8, further comprising:
   a mask positioned at a location optically conjugate with the photosensitive substrate;
   an optical collimating system for collimating the laser beam after passing through the mask and positioned after the mask along the reference axis; and
   a substrate positioned after the optical collimating system and optically conjugate with the mask.

11. A method of controlling a position of a laser beam in the illumination apparatus of claim 8, comprising the steps of:

positioning the movable shutting member in an optical path;

detecting the position and the direction of the laser beam using the detecting unit;

adjusting the direction of the laser beam using the angle adjusting unit;

removing the movable shutting member from the optical path and detecting the position of the laser beam using the detector; and adjusting the position of the laser beam using the parallel moving unit.

12. The illumination apparatus of claim 8, wherein the light source comprises a laser source emitting a laser beam; and the beamsplitter splits off a portion of the laser beam towards a detecting unit having a surface conjugate with the photosensitive substrate.

13. The illumination apparatus of claim 8, wherein a collimating lens directs the plurality of beams onto the mask, and wherein an entering surface of the optical integrator is nearly optically conjugate with the mask.

14. A method for fabricating semiconductor device by using an exposure apparatus according to claim 8, comprising the step of:

illuminating the mask with the light beam from the illumination optical system; and exposing the pattern upon the photosensitive substrate.

15. The method for fabricating semiconductor device according to claim 14, further comprising the step of:

adjusting a position of the light beam directed to the illumination optical system before the step of illuminating the mask and the step of exposing the pattern;

wherein the step of adjusting the position of the light beam comprises:

a first detecting step for detecting the angle of the light beam from the light source optical system through the light shutting unit by using the detecting unit while the light shutting unit is located in an optical path between the light source and the illumination optical system;

a first correcting step for correcting an angle of the light beam entering the optical integrator by using the angle adjusting unit based on a first detecting information of the first detecting step;

a second detecting step for detecting the position of the light beam from the light source optical system by using the detecting unit while the light shutting unit is located out of the optical path between the light source and the illumination optical system; and a second correcting step for correcting a position of the light beam entering the optical integrator by using the deviation compensating unit based on a second detecting information of the second detecting step.

16. The exposure apparatus according to claim 8, further comprising a projection optical system disposed between the mask and the photosensitive substrate.

17. A method for fabricating semiconductor device by using an exposure apparatus according to claim 16, comprising the steps of:

illuminating the mask with the light beam from the illumination system; and exposing the predetermined pattern upon the photosensitive substrate through the projection optical system.

18. The method for fabricating semiconductor device according to claim 14, further comprising the step of:

adjusting a position of the light beam directed to the illumination optical system before the step of illuminating the mask and the step of exposing the pattern;

wherein the step of adjusting the position of the light beam comprises:

a first detecting step for detecting the angle of the light beam from the light source optical system through the light shutting unit by using detecting unit while the light shutting unit is located in an optical path between the light source and the illumination optical system;

a first correcting step for correcting an angle of the light beam entering the optical integrator by using the angle adjusting unit based on a first detecting information of the first detecting step;

a second detecting step for detecting the position of the light beam from the light source optical system by using the detecting unit while the light shutting unit is located out of the optical path between the light source and the illumination optical system; and a second correcting step for correcting a position of the light beam entering the optical integrator by using the deviation compensating unit based on a second detecting information of the second detecting step.

19. The exposure apparatus according to claim 8, further comprising a driving unit for driving the light shutting unit for inserting the light shutting unit in the optical path between the light source and the illumination optical system or to remove the light shutting unit from the optical path between the light source and the illumination optical system.

20. A method for fabricating semiconductor device by using an exposure apparatus according to claim 19, comprising the steps of:

illuminating the mask with the light beam from the illumination optical system; and exposing the pattern of the predetermined mask upon the photosensitive substrate through the projection optical system.

21. The method for fabricating semiconductor device according to claim 20, further comprising the step of:

adjusting a position of the light beam directed to the illumination optical system before the illuminating step and the exposing step;

wherein the step of adjusting the position of the light beam comprises:

a first detecting step for detecting the angle of the light beam from the light source optical system through the light shutting unit by using the detecting unit while the light shutting unit is located in an optical path between the light source and the illumination optical system by using the driving unit;

a first correcting step for correcting an angle of the light beam entering the optical integrator by using the angle adjusting unit based on a first detecting information of the first detecting step;

a second detecting step for detecting the position of the light beam from the light source optical system by using the detecting unit while the light shutting unit is located out of the optical path between the light source and the illumination optical system by using the driving unit; and a second correcting step for correcting a position of the light beam entering the optical integrator by using the deviation compensating unit based on a second detecting information of the second detecting step.

22. An exposure apparatus according to claim 16, further comprising a driving unit for driving the light shutting unit for inserting the light shutting unit in the optical path between the light source and the illumination optical system or for removing the light shutting unit from the optical path between the light source and illumination optical system.

23. A method for fabricating semiconductor device by using an exposure apparatus according to claim 22, comprising the step of:
   illuminating the mask with the light beam from the illumination optical system; and
   exposing the predetermined pattern upon the photosensitive substrate through the projection optical system.

24. A method for fabricating semiconductor device according to claim 21, further comprising the step of:
   adjusting a position of the light beam directed to the illumination optical system before the illuminating step and the exposing step:
      wherein the adjusting step of the position of the light beam comprises:
      a first detecting step for detecting the angle of the light beam from the light source optical system through the light shutting unit by using the detecting unit while the light shutting unit is located in an optical path between the light source and the illumination optical system by using the driving unit;
      a first correcting step for correcting an angle of the light beam entering the optical integrator based on a first detecting information of the first detecting step by using the angle adjusting unit;
      a second detecting step for detecting the position of the light beam from the light source optical system by using the detecting unit while the light shutting unit is located out of the optical path between the light source and the illumination optical system by using the driving unit; and
      a second correcting step for correcting a position of the light beam entering the optical integrator by using the deviation compensating unit based on a second detecting information of the second detecting step.

25. An exposure apparatus according to claim 8, wherein a detecting unit comprises a transparent plate having an indication mark and positioned optically conjugate with the mask.

26. A method for fabricating semiconductor device by using an exposure apparatus according to claim 25, comprising the steps of:
   illuminating the mask with the light beam from the illumination optical system; and
   exposing the predetermined pattern upon the photosensitive substrate through the projection optical system.

27. A method for fabricating semiconductor device according to claim 26, further comprising the step of:
   adjusting a position of the light beam directed to the illumination optical system before the illuminating step and the exposing step;
   wherein the adjusting step comprises:
      a first detecting step for detecting the angle of the light beam from the light source optical system through the light shutting unit by using the detecting unit while the light shutting unit is located in an optical path between the light source and the illumination optical system;
      a first correcting step for correcting an angle of the light beam entering the optical integrator by using the angle adjusting unit based on a first detecting information of the first detecting step;
      a second detecting step for detecting the position of the light beam from the light source optical system by using the detecting unit while the light shutting unit is located out of the optical path between the light source and the illumination optical system; and
      a second correcting step for correcting a position of the light beam entering the optical integrator by using the deviation compensating unit based on a second detecting information of the second detecting step.

28. The illumination apparatus according to claim 1, further comprising a driving unit for driving the light shutting unit inserting the light shutting unit in the optical path between the light source and the predetermined surface or for removing the light shutting unit from the optical path between the light source and the predetermined surface.

29. The illumination apparatus according to claim 1, wherein the parallel moving unit includes a first plate rotatable about a first axis and a second plate rotatable about a second axis different from the first axis.

30. The illumination apparatus according to claim 1, wherein the detecting unit detects an inclination of the light relative to the reference axis.

31. The illumination apparatus according to claim 30, wherein the angle adjusting unit includes a pair of refracting dispersing prisms having substantially identical apex angles and wherein each of the pair of refracting dispersing prisms is individually rotatable around the reference axis.

32. The illumination apparatus according to claim 1, wherein the parallel moving unit includes a first planar plate rotatable around a first axis perpendicular to the reference axis, and a second planar plate rotatable around a second axis perpendicular to the reference axis and perpendicular to the first axis;
   the illumination apparatus further including:
      a frequency converter for converting the light beam to a visible spectrum light beam and located in an optical path between the transparent plate and the beamsplitter.
      a controller controlling the angle adjusting unit and the parallel moving unit; and
      a collecting system disposed between the light source and the beamsplitter,
   wherein the detecting unit includes a two-dimensional charge coupled device disposed at the predetermined surface and supplying a detecting signal to the controller, and a transparent plate disposed at the predetermined surface and having an indication mark,
   wherein the collecting system includes a first collecting system for collecting the light beam from the light source and a second collecting system for collecting the light beam from first collecting system and directing the light beam from the first collecting system to the illuminated surface,
   wherein the light source includes an excimer laser,
   wherein the predetermined surface is disposed at an optically conjugate position with the illuminated surface,
   wherein the reference axis is an optical axis of the first collecting system and the second collecting system,
   wherein the angle adjusting unit and the parallel moving unit are located in an optical path between the light source and the beamsplitter, and
   wherein a transparent plate having an indication mark is positioned optically conjugate with the illuminated surface between the detecting unit and the beamsplitter.

33. An illumination apparatus comprising:

a light source;

an illumination optical system receiving light from a light source and directing the light towards a mask;

an angle adjuster for aligning the light along an optical axis of the illumination optical system;

a parallel moving unit for compensating for positional deviations of the light; and a light shutter movable in and out of an optical path between the light source and the mask while the angle adjuster aligns the light along the reference axis, and wherein the light shutter is located out of the optical path between the light source and the mask while the parallel moving unit compensates for positional deviation of the light;

a beamsplitter disposed in an optical path between the light source and the illumination optical system and diverting a portion of the light; and a detector that detects deviation of the light directed toward the illumination optical system using the portion of light diverted by the beamsplitter.

34. The illumination apparatus according to claim 33, wherein the detector detects an inclination of the light relative to an optical axis of the illumination optical system.

35. An exposure method, comprising the steps of:

illuminating a mask using the illumination apparatus of claim 33; and exposing a pattern on the mask onto a photosensitive substrate.

36. An exposure apparatus comprising:

an illumination apparatus that illuminates a mask with light from a light source; and a projection system for projecting an image of a pattern on the mask onto a photosensitive substrate, wherein the illumination apparatus includes:

an illumination optical system for receiving the light and directing the light towards the mask;

an angle adjuster for aligning the light along an optical axis of the illumination optical system;

a parallel moving unit for compensating for positional deviations of the light; and a light shutter movable in and out of an optical path between the light source and the mask while the angle adjuster aligns the light along the reference axis, and wherein the light shutter is located out of the optical path between the light source and the mask while the parallel moving unit compensates for positional deviation of the light;

a beamsplitter disposed in an optical path between the light source and the illumination optical system and diverting a portion of the light; and a detector that detects a deviation of the light directed towards the illumination optical system using the portion of light diverted by the beamsplitter.

37. The exposure apparatus according to claim 36, wherein the detector detects an inclination of the light incident upon the illumination optical system.

38. An exposure method utilizing the apparatus of claim 36, the method comprising the steps of:

illuminating the mask using the illumination apparatus; and exposing the pattern on the mask onto the photosensitive substrate using the projection system.

* * * * *